United States Patent [19]

Kukla et al.

[11] Patent Number: 5,133,850

[45] Date of Patent: Jul. 28, 1992

[54] SPUTTERING CATHODE FOR COATING SUBSTRATES IN CATHODE SPUTTERING APPARATUS

[75] Inventors: Reiner Kukla, Hanau; Eggo Sichmann, Gelnhausen; Wolf-Eckart Fritsche, Kleinostheim, all of Fed. Rep. of Germany

[73] Assignee: Leybold Aktiengesellschaft, Hanau, Fed. Rep. of Germany

[21] Appl. No.: 654,118

[22] Filed: Feb. 11, 1991

[30] Foreign Application Priority Data

Dec. 31, 1990 [DE] Fed. Rep. of Germany ....... 4042286

[51] Int. Cl.$^5$ ............................................. C23C 14/34
[52] U.S. Cl. .......................... 204/298.12; 204/298.18; 204/298.19; 204/298.21
[58] Field of Search ....................... 204/298.12, 298.17, 204/298.18, 298.21, 298.19

[56] References Cited

U.S. PATENT DOCUMENTS

| 4,100,055 | 7/1978 | Rainey | 204/298.12 |
| 4,370,217 | 1/1983 | Funaki | 204/298.12 |
| 4,405,436 | 9/1983 | Kobayashi et al. | 204/298.12 X |
| 4,414,086 | 11/1983 | Lamont | 204/192 |
| 4,486,287 | 12/1984 | Fournier | 204/298.12 X |
| 4,604,180 | 8/1986 | Hirukawa et al. | 204/298.12 X |
| 4,747,926 | 5/1988 | Shimuzu | 204/298 |
| 4,933,064 | 6/1990 | Geisler et al. | 204/298.17 |

FOREIGN PATENT DOCUMENTS 63-103065 5/1988 Japan .
63-270462 2/1989 Japan .

Primary Examiner—Nam Nguyen
Attorney, Agent, or Firm—Felfe & Lynch

[57] ABSTRACT

Cathode base (1) has a hollow target (8) disposed thereon with at least one planar sputtering surface (8a), of circular shape for example, which is encompassed by at least two concentric, continuous projections (8b, 8c), and with a magnet system (6) with pole faces (6c, 6d) of opposite polarity lying on both sides of the target (8) for the production of magnetic lines of force (11, 11', ...) running substantially parallel to the sputtering surface (16a), the wall surfaces (8d, 8e) of the projections (8b, 8c) of the target (8), adjoining the sputtering surface (8a) being disposed at an angle ($a$) to the perpendicular, is preferably in a range between 30 and 70 degrees.

4 Claims, 2 Drawing Sheets

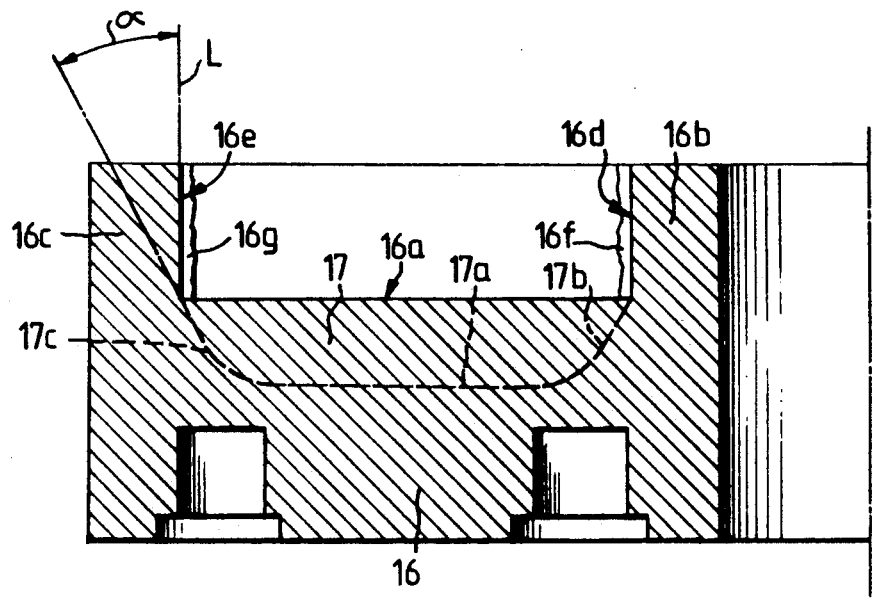
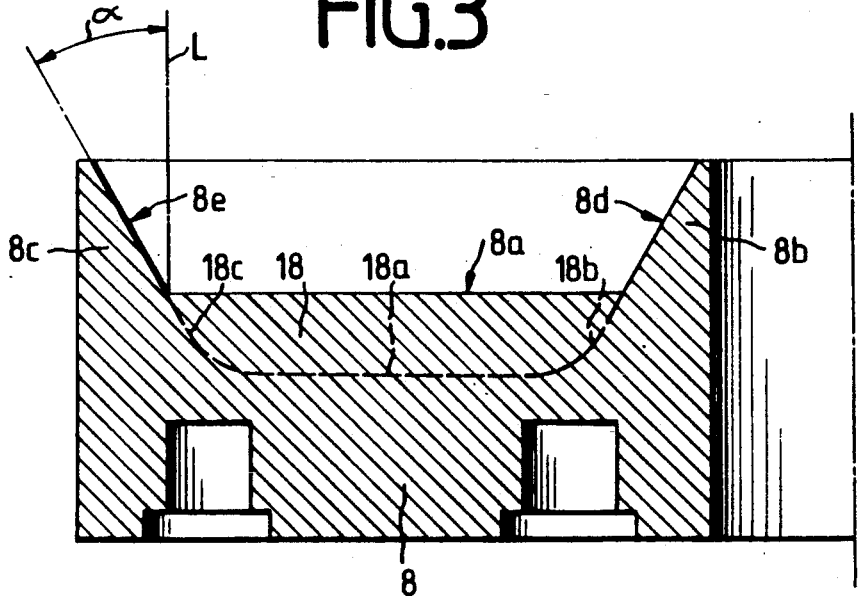

SPUTTERING CATHODE FOR COATING SUBSTRATES IN CATHODE SPUTTERING APPARATUS

BACKGROUND OF THE INVENTION

The invention relates to a sputtering cathode for coating substrates in cathode sputtering apparatus having a cathode base body and a hollow target disposed thereon. The target has at least one planar sputtering surface of annular shape, for example, which is surrounded by at least two continuous concentric projections. A magnet system with pole faces of opposite polarity lies on both sides of the target for the production of magnetic lines of force running substantially parallel to the sputtering surface.

Sputtering cathodes for coating substrates in cathode sputtering apparatus are known (U.S. Pat. No. 4,933,064, U.S. Pat. No. 4,486,287), which consist essentially of a cathode base body, a hollow target disposed thereon, as well as a magnet system encompassing the target, and which are called ZPT hollow magnetrons (ZPT = target between poles) on account of the way they are constructed. The hollow targets commonly used in such hollow magnetrons have continuous concentric projections, while the wall surfaces of the projections of the target adjoining the sputtering surfaces have thus far been arranged perpendicular to the sputtering surface in the sputtering direction.

This type of construction produces two contrary phenomena which heretofore have not been reconcilable with one another. On the one hand it would be desirable to achieve magnetic lines of force running parallel to the sputtering surface in order to achieve the highest possible sputtering rates. On the other hand, the magnetic lines of force issue in a substantially perpendicular direction from the one wall surface of the one projection of the target, namely the wall surface adjoining the sputtering surface, and after crossing the sputtering surface they return in a substantially vertical direction into the other, opposite wall surface of the other projection. Since these wall surfaces are penetrated by the magnetic lines of force in a substantially perpendicular direction, they are no longer available for the sputtering; on the contrary, the material removed from the sputtering surface during the sputtering process is deposited on these wall surfaces and disadvantageously forms a coating which is not desired on these surfaces. After a sufficient coating thickness has been established by the sputtering process using a metal target material, the coating that forms spalls off in the described target areas, rendering the target useless and definitely leading to the failure of the entire sputtering apparatus.

In the reactive operation of the sputtering cathode an undesired coating of the target margins with dielectric material takes place, which leads to arcing and thus also to the shut-down of the sputtering process.

It is therefore the object of the invention to prevent the coating of the wall surfaces of the target projections with target material and to preserve the advantages of the hollow magnetron, i.e., to achieve a good lateral electrostatic confinement of the plasma and good utilization of the target material.

SUMMARY OF THE INVENTION

This object is achieved in accordance with the invention in that the wall surfaces of the target projections adjoining the sputtering surfaces are disposed at an angle α to the perpendicular of the sputtering surface, this slope angle being preferably in a range between 30 and 70 degrees.

The hollow target according to the invention, for a sputtering cathode for coating substrates in cathode sputtering apparatus, has all the advantages of the hollow target long in use, and avoids both in metallic and in reactive operation the undesired coating of the wall surfaces of the target projections with target material.

DESCRIPTION OF THE DRAWINGS

FIG. 2 is an enlarged cross section of a circular hollow target of conventional construction, and FIG. 3 is an enlarged cross section of a hollow target of FIG. 1.

DETAILED DESCRIPTION OF THE PREFERRED EMBODIMENT

Figure 1:
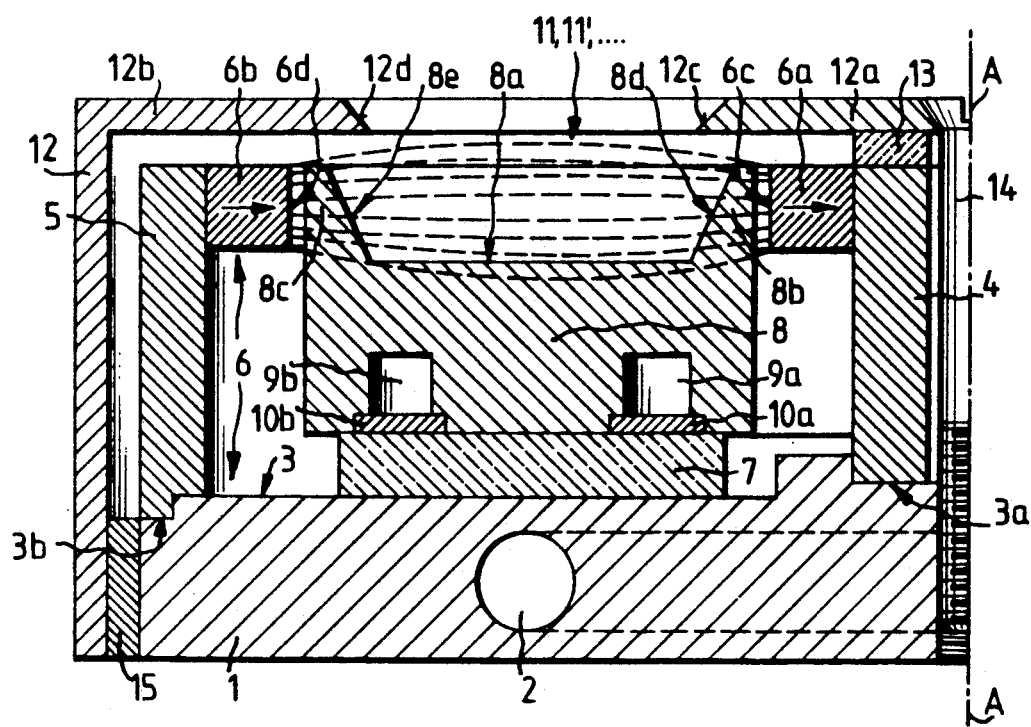
FIG. 1 is an axial cross section through an embodiment of the essential parts of a round cathode with a hollow target in accordance with the invention for cathode sputtering.

In FIG. 1 is represented a cathode base 1, which consists of a ferromagnetic material and at the same time forms the yoke for the magnet system described below. The cathode base 1 consists of a substantially disk-shaped body with an annular cooling passage 2. On an upper plane 3 of the base 1 are provided annular supporting surfaces 3a, 3b, which serve for centering a sleeve 4 and a ring 5, both being made of a soft magnetic material. Parts 4 and 5 are adjoined by respective permanent magnets 6a and 6b of a magnet system 6. The latter magnets are an inner ring magnet 6a and an outer ring magnet 6b, both being magnetized radially with respect to the central axis A—A of the system, such that the polarity (see arrows) of both magnets 6a and 6b points inwardly to the axis A—A. The magnets 6a and 6b have pole faces on their outer and inner cylindrical surfaces, respectively, the opposite pole faces 6c and 6d facing one another.

Between the two supporting surfaces 3a and 3b, an annular insulator 7 lies on the upper plane 3 of the cathode base 1 and serves to support a hollow target 8. This target 8 is the starting material for the coating that is to be deposited on a substrate not shown in the drawing. The target 8 consists essentially of an annular body having a planar sputtering surface 8a seen in section, which is bordered on each side by two continuous concentric projections 8b, 8c, which extend in the sputtering direction and consist of the same material as the remainder of the target 8. The projections 8b and 8c have wall surfaces 8d and 8e facing one another, which slope at an angle to the plane of the sputtering surface 8a.

To be able to carry away the heat entering the target during the sputtering, concentrically disposed cooling passages 9a and 9b run concentrically in the side of target 8 facing the upper plane 3 and are closed off by annular plates 10a and 10b.

The pole faces 6c and 6d on both sides of the projections 8b and 8c extend so far in the sputtering direction above the plane of the sputtering surface 8a that the magnetic lines of force 11, 11' . . . issue from the pole face 6b in a substantially perpendicular manner and, after crossing the sputtering surface 8a, return to the other, opposite pole face 6c of the other magnet, in a substantially perpendicular manner.

The magnet system 6 is surrounded by a shield 12 consisting of a disk-shaped central portion 12a and an annular peripheral portion 12b. The central portion 12a rests on a spacer ring 13 on the sleeve 4 and is connected to the cathode base 1 in an electrically conductive manner. The peripheral portion 12b is connected in an electrically conductive manner to the cathode base 1 through an additional spacer ring 15. The two facing edges 12c and 12d of shield 12 also overreach the confronting sides of the projections 8b and 8c.

The projections 16b and 16c of a conventional hollow target 16 (FIG. 2) are so configured that the wall surfaces 16d and 16e are perpendicular to the sputtering surface 16a. This produces on the surfaces 16d and 16e coatings 16f and 16g of sputtered target material which deposits itself thereon and their surface assumes an irregular, rough shape. Between the two wall surfaces 16d and 16e a trough-like sputter pit 17 (represented in broken lines) in the sputtering surface 16a, which runs about parallel to the plane of the original sputtering surface 16a, and which furthermore has two lateral boundary lines 17b and 17c which run at an angle α, the slope angle, to the wall surfaces 16d and 16e. A target 8 in accordance with the invention (FIG. 3) differs from the target 16 described in FIG. 2 in that the wall surfaces 8d and 8e of the projections 8b and 8c are not perpendicular to the sputtering surface 8a but run at an angle α in prolongation of the lateral boundary surfaces 18b and 18c of the sputter pit 18 that is being created. The slope angle α is preferably between 30 and 70 degrees from the perpendicular of the sputtering surface 8a. The bottom boundary surfaces 18a of the sputter pit 18 runs approximately parallel to the original sputtering surface 8a.

We claim:

1. Sputtering cathode for coating substrates in cathode sputtering apparatus, comprising
   a cathode base
   an annular target disposed on said base and comprising a planar sputtering surface of ciruitous shaped bounded by two concentric upstanding projections, said projections having mutually facing diverging wall surfaces which adjoin the sputtering surface and are disposed at angles between 30 and 70 degrees to the perpendicular of the sputtering surface, and
   a magnet system having mutually facing pole faces of opposite polarity lying on opposite sides of said projections for producing magnetic lines of force running substantially parallel to said sputtering surface.

2. Sputtering cathode as in claim 1 wherein, during use, a sputtering pit having a bottom surface and lateral boundary surfaces is formed in said planar sputtering surface, said lateral boundary surfaces extending at respective angles to the bottom surface, said angles of said wall surfaces being selected to represent rectilinear extensions of said angles of said lateral boundary surfaces.

3. Sputtering cathode as in claim 1 wherein said projections consist of the same material as said sputtering surface.

4. Sputtering cathode as in claim 1 wherein said projections are formed of a material different from the material of the sputtering surface.

* * * * *